(12) United States Patent
Shimoyama

(10) Patent No.: US 11,778,761 B2
(45) Date of Patent: Oct. 3, 2023

(54) ELECTRONIC DEVICE

(71) Applicant: JVCKENWOOD Corporation, Yokohama (JP)

(72) Inventor: Takeshi Shimoyama, Yokohama (JP)

(73) Assignee: JVCKENWOOD Corporation, Yokohama (JP)

( * ) Notice: Subject to any disclaimer, the term of this patent is extended or adjusted under 35 U.S.C. 154(b) by 219 days.

(21) Appl. No.: 17/460,376

(22) Filed: Aug. 30, 2021

(65) Prior Publication Data

US 2021/0392762 A1    Dec. 16, 2021

Related U.S. Application Data

(63) Continuation of application No. PCT/JP2019/043753, filed on Nov. 7, 2019.

(30) Foreign Application Priority Data

Mar. 8, 2019   (JP) ................. 2019-043105

(51) Int. Cl.
*B60K 35/00*   (2006.01)
*H05K 5/02*   (2006.01)
(Continued)

(52) U.S. Cl.
CPC ......... *H05K 5/0213* (2013.01); *G06F 3/0414* (2013.01); *H05K 5/0017* (2013.01);
(Continued)

(58) Field of Classification Search
None
See application file for complete search history.

(56) References Cited

U.S. PATENT DOCUMENTS 7,911,555 B2 *   3/2011   Fukayama ........ G02F 1/133308
                                                    349/58
8,208,272 B2 *   6/2012   Kurahashi ................ H05K 5/02
                                                    361/810

(Continued)

FOREIGN PATENT DOCUMENTS

JP           4842653       12/2011
JP        2013-003195       1/2013

OTHER PUBLICATIONS

International Search Report and Written Opinion for International Application No. PCT/JP2019/043753 dated Dec. 10, 2019, 8 pages.

(Continued)

*Primary Examiner* — Xanthia C Cunningham
(74) *Attorney, Agent, or Firm* — AMIN, TUROCY & WATSON, LLP

(57) ABSTRACT

An electronic device includes a display panel including a display surface on a front; a front panel surrounding the display panel; a circuit board that is disposed on a front side of a lower portion of the display panel and housed in the front panel; and a holder provided between the front of the display panel and a back of the circuit board. The holder includes a plurality of grooves each continuously extending in an up-down direction on a back of the holder facing the front of the display panel. The plurality of grooves are formed so as to be connected to each other. The front panel is formed with a through hole facing lower ends of the grooves.

7 Claims, 4 Drawing Sheets

(51) Int. Cl.
*G06F 3/041* (2006.01)
*H05K 5/00* (2006.01)

(52) U.S. Cl.
CPC ........ *B60K 35/00* (2013.01); *B60K 2370/152* (2019.05); *G06F 2203/04105* (2013.01)

(56) References Cited

U.S. PATENT DOCUMENTS

| | | | |
|---|---|---|---|
| 9,116,376 B2* | 8/2015 | Isami | G02F 1/133308 |
| 9,491,893 B2* | 11/2016 | Ogura | G06F 1/1601 |
| 10,070,540 B2* | 9/2018 | Campagna | H05K 5/06 |
| 2004/0135482 A1* | 7/2004 | Thielemans | G09F 9/33 |
| | | | 313/33 |
| 2005/0105012 A1* | 5/2005 | Kim | H04N 5/64 |
| | | | 348/E5.128 |
| 2007/0188675 A1* | 8/2007 | Tsubokura | G02F 1/133308 |
| | | | 349/58 |
| 2010/0246157 A1* | 9/2010 | Kurahashi | H05K 5/02 |
| | | | 361/829 |
| 2012/0194971 A1* | 8/2012 | Marker | H04N 5/64 |
| | | | 361/679.01 |
| 2013/0170156 A1* | 7/2013 | Jung | G02F 1/133308 |
| | | | 361/749 |
| 2014/0009717 A1 | 1/2014 | Isami et al. | |

OTHER PUBLICATIONS

Extended European Search Report for European Patent Application No. 19918613.1 dated Mar. 3, 2022.

* cited by examiner

ELECTRONIC DEVICE

CROSS-REFERENCE TO RELATED APPLICATIONS

This application is a Continuation of PCT International Application No. PCT/JP2019/043753 filed on Nov. 7, 2019 which claims the benefit of priority from Japanese Patent Application No. 2019-043105 filed on Mar. 8, 2019, the entire contents of both of which are incorporated herein by reference.

BACKGROUND OF THE INVENTION

1. Field of the Invention

The present disclosure relates to an electronic device.

2. Description of the Related Art

For example, a display device disclosed in Japanese Patent No. 4842653 includes a display panel and a frame member that supports an outer peripheral portion of a display surface of the display panel. One end of a circuit board is connected to a lower side of the display surface of the standing display panel. A waterproof sheet is attached between the display panel and the frame member at the lower side of the display surface. The waterproof sheet extends along a surface facing the display panel of the frame member, and extends between the circuit board and the frame member. Furthermore, the frame member has a through hole in a portion where the waterproof sheet extends.

In Japanese Patent No. 4842653, for example, when the display surface of the display panel is wiped with a cloth moistened with water, even if water enters the inside the frame member through a gap between the display panel and the frame member, the water is accumulated between a waterproof sheet and the frame member to prevent corrosion of the circuit board due to the accumulated water. Furthermore, in Patent Literature 1, the water accumulated between the waterproof sheet and the frame member can be drained to the outside of the frame member through the through hole.

Japanese Patent No. 4842653 is based on the premise that the water that has entered the inside of the frame member is accumulated between the waterproof sheet and the frame member and then drained to the outside of the frame member through the through hole after being accumulated.

In an electronic device, however, it is not preferable to store water from the viewpoint of protecting an electrical system such as a circuit board even when a waterproof sheet is provided. Therefore, it is desired to drain the water without storing it.

SUMMARY OF THE INVENTION

An electronic device according to an aspect of the present disclosure includes a display panel including a display surface on a front; a front panel surrounding the display panel; a circuit board that is disposed on a front side of a lower portion of the display panel and housed in the front panel; and a holder provided between the front of the display panel and a back of the circuit board. The holder includes a plurality of grooves each continuously extending in an up-down direction on a back of the holder facing the front of the display panel. The plurality of grooves are formed so as to be connected to each other. The front panel is formed with a through hole facing lower ends of the grooves.

The above and other objects, features, advantages and technical and industrial significance of this invention will be better understood by reading the following detailed description of presently preferred embodiments of the invention, when considered in connection with the accompanying drawings.

DETAILED DESCRIPTION

Hereinafter, an embodiment for carrying out the present disclosure (hereinafter, referred to as an embodiment) will be described in detail with reference to the drawings. Note that the present disclosure is not limited by the following embodiment. Furthermore, components in the following embodiment include those that can be easily assumed by those skilled in the art, those that are substantially the same, and those within a so-called equivalent range. Moreover, the components disclosed in the following embodiment can be appropriately combined.

Figure 1:
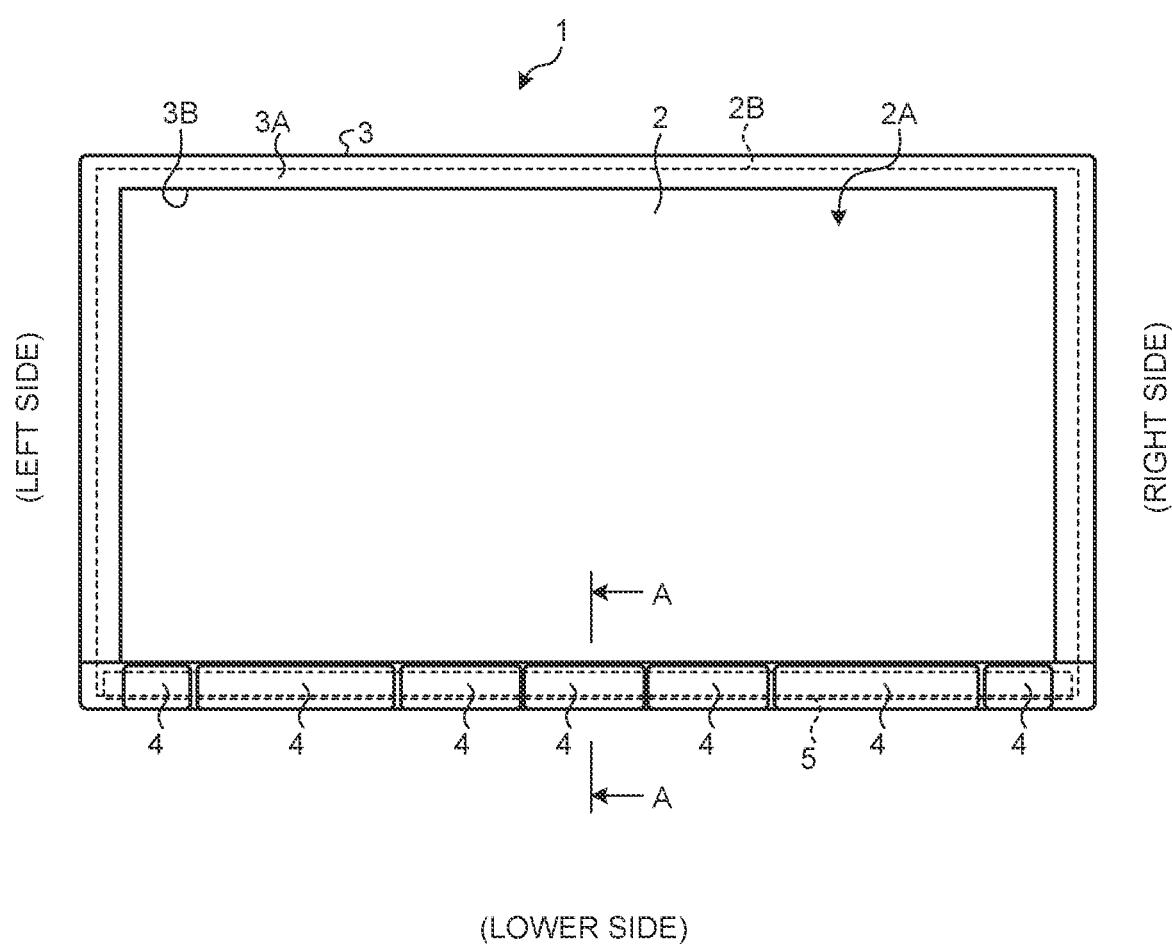
FIG. 1 is a front view illustrating an electronic device according to an embodiment of the present disclosure.
Figure 2:
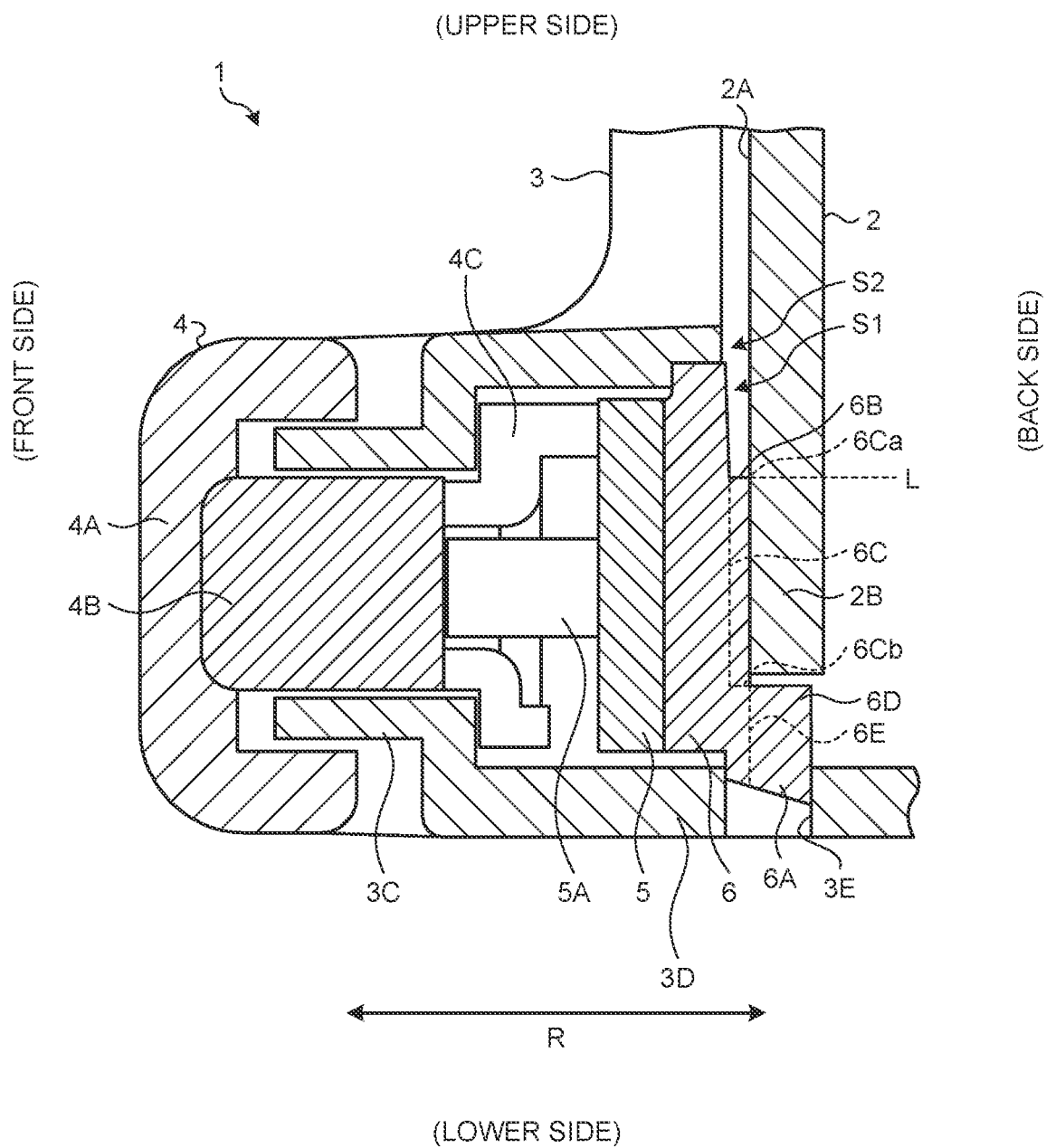
FIG. 2 is an enlarged cross-sectional view taken along line A-A in FIG. 1.

FIG. 1 is a front view illustrating an electronic device according to the present embodiment. FIG. 2 is an enlarged cross-sectional view taken along line A-A in FIG. 1.

As illustrated in FIGS. 1 and 2, an electronic device 1 according to the present embodiment is, for example, an audio visual (AV) integrated car navigation device mounted inside a vehicle. The electronic device 1 includes a display panel 2, a front panel 3, an operation unit 4, a circuit board 5, and a holder 6.

The display panel 2 is formed in a rectangular shape, and has a display surface 2A on the front. The front is a surface viewed by an operator. In the case of a car navigation device, the car navigation device is disposed in a front portion of a vehicle, so that the front faces the rear of the vehicle. The display surface 2A has a rectangular shape smaller than the rectangular shape of the display panel 2, and is disposed inside an outer edge 2B of the display panel 2. In the present embodiment, the display panel 2 is a touch panel having a pressure-sensitive display surface 2A.

The front panel 3 is formed in a rectangular shape so as to surround the display panel 2. The front panel 3 includes a rectangular frame portion 3A and a rectangular window portion 3B. The frame portion 3A surrounds the display panel 2. The window portion 3B opens the display surface 2A of the display panel 2 inside the frame portion 3A.

As illustrated in FIG. 1, a plurality of operation units 4 are arranged side by side in a left-right direction on the front side of the front panel 3 and on the lower side of the front panel 3. Note that the left and right are the case when viewed from the front side as illustrated in FIG. 1. The "right side" and the "left side" in FIGS. 3 and 4, which is described below, viewed from the back side are also indicated based on the case when viewed from the front side. As illustrated in FIG. 2, the operation unit 4 includes a key 4A, a knob 4B, and a hinge 4C. The key 4A is a portion provided on the outer front side of the front panel 3. An operator pushes and operates the key 4A. The knob 4B is disposed on the back side of the key 4A, and the hinge 4C is integrally connected to the back side of the knob 4B. The knob 4B and the hinge 4C are formed of resin material and the like. The hinge 4C is formed in a rod or plate shape so as to be elastically deformed, and is formed in a curved or bent manner. Therefore, the knob 4B is movable to the back side together with the key 4A due to deformation of the hinge 4C when the key 4A is pushed to the back side by the operator. Furthermore, when the key 4A is not operated by the operator, the elasticity of the hinge 4C biases the knob 4B together with the key 4A to the front side. Note that, as illustrated in FIG. 2, the front panel 3 is provided with a guide portion 3C so as to surround the upper, lower, right, and left sides of the knob 4B. The front panel 3 guides the movement of the knob 4B with the guide portion 3C. The key 4A is disposed to cover the front side of the guide portion 3C so as not to prevent the movement of the knob 4B.

The circuit board 5 is disposed along the front of the display panel 2 in the lower portion of the display panel 2. In the present embodiment, the circuit board 5 is continuously provided in the left-right. As illustrated in FIG. 2, a tact switch, which is a switch element 5A, is mounted on the front of the circuit board 5. The switch element 5A is disposed so as to face the back side of the knob 4B of each of a plurality of operation units 4. Therefore, when the key 4A is pushed by the operator to the back side, the switch element 5A operates by movement of the knob 4B to the back side together with the key 4A due to deformation of the hinge 4C. Note that, as referred to in FIG. 3, not one but a plurality of (two in present embodiment) switch elements 5A may be provided on the back side of one operation unit 4. The circuit board 5 is housed in the front panel 3. Specifically, a case 3D is formed in the front panel 3. The case 3D extends to the back more than the above-described guide portion 3C, and surrounds the upper, lower, right, and left sides. The circuit board 5 is housed in the case 3D.

As illustrated in FIG. 2, the holder 6 is provided in the lower portion of the display panel 2 so as to be sandwiched between the front of the display panel 2 and the back of the circuit board 5. The holder 6 is formed in a plate shape, is provided so as to close the back side of the case 3D of the front panel 3 in which the circuit board 5 is housed, and is attached to the front panel 3. Specifically, the holder 6 includes protrusions 6A to be inserted into through holes 3E formed in the bottom portion of the front panel 3. The holder 6 is attached to the front panel 3 by fitting the protrusions 6A into the through holes 3E.

Furthermore, the holder 6 is provided in contact with the back of the circuit board 5 by being attached to the front panel 3. As described above, when the key 4A is pushed to the back side by the operator, the switch element 5A of the circuit board 5 operates by movement of the knob 4B together with the key 4A to the back side due to deformation of the hinge 4C. At the time, the holder 6 abuts on the back of the circuit board 5 to generate reaction force against the circuit board 5 being pushed toward the back side.

Furthermore, the holder 6 is provided in contact with the front of the display panel 2 by being attached to the front panel 3. However, since the display panel 2 is configured as a touch panel including a pressure-sensitive display surface 2A in the present embodiment, it is necessary to prevent the holder 6 from coming into contact with the display surface 2A. For that reason, the holder 6 is formed with a stepped portion 6B that protrudes to the back side on the lower side of a region (broken line L in FIG. 2) of the display surface 2A, and a gap S1 is provided between the holder 6 and the front of the display surface 2A. Similarly, a gap S2 is provided between the front panel 3 and the front of the display surface 2A in order to prevent the front panel 3 from coming into contact with the display surface 2A.

As described above, the gaps S1 is provided between the holder 6 and the front of the display surface 2A, and the gap S2 is provided between the front panel 3 and the front of the display surface 2A. Therefore, for example, when the display surface 2A is wiped with a cloth containing water or a beverage is accidentally splashed on the display surface 2A, water (water or beverage is collectively referred to as water) may enter the inside of the front panel 3 from the gaps S1 and S2, and may affect the circuit board 5 and the electrical system of the display panel 2. The electronic device 1 of the present embodiment is provided with a drainage structure against such entering of water.

Figure 3:
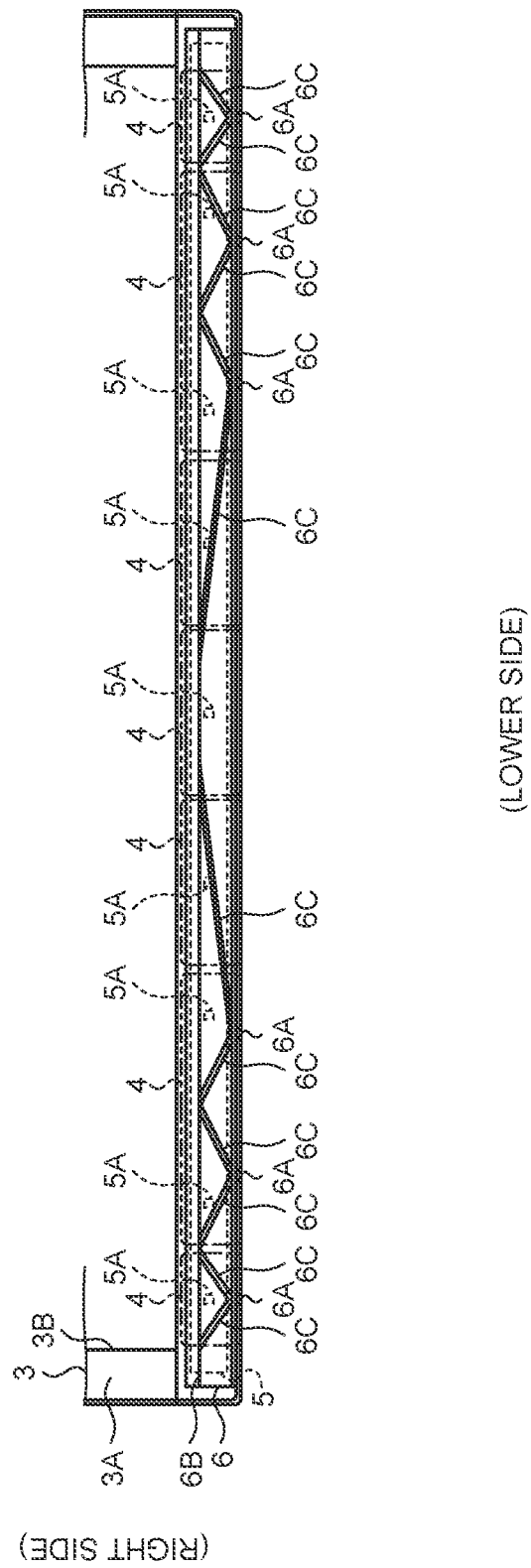
FIG. 3 is a back view of a holder.
Figure 4:
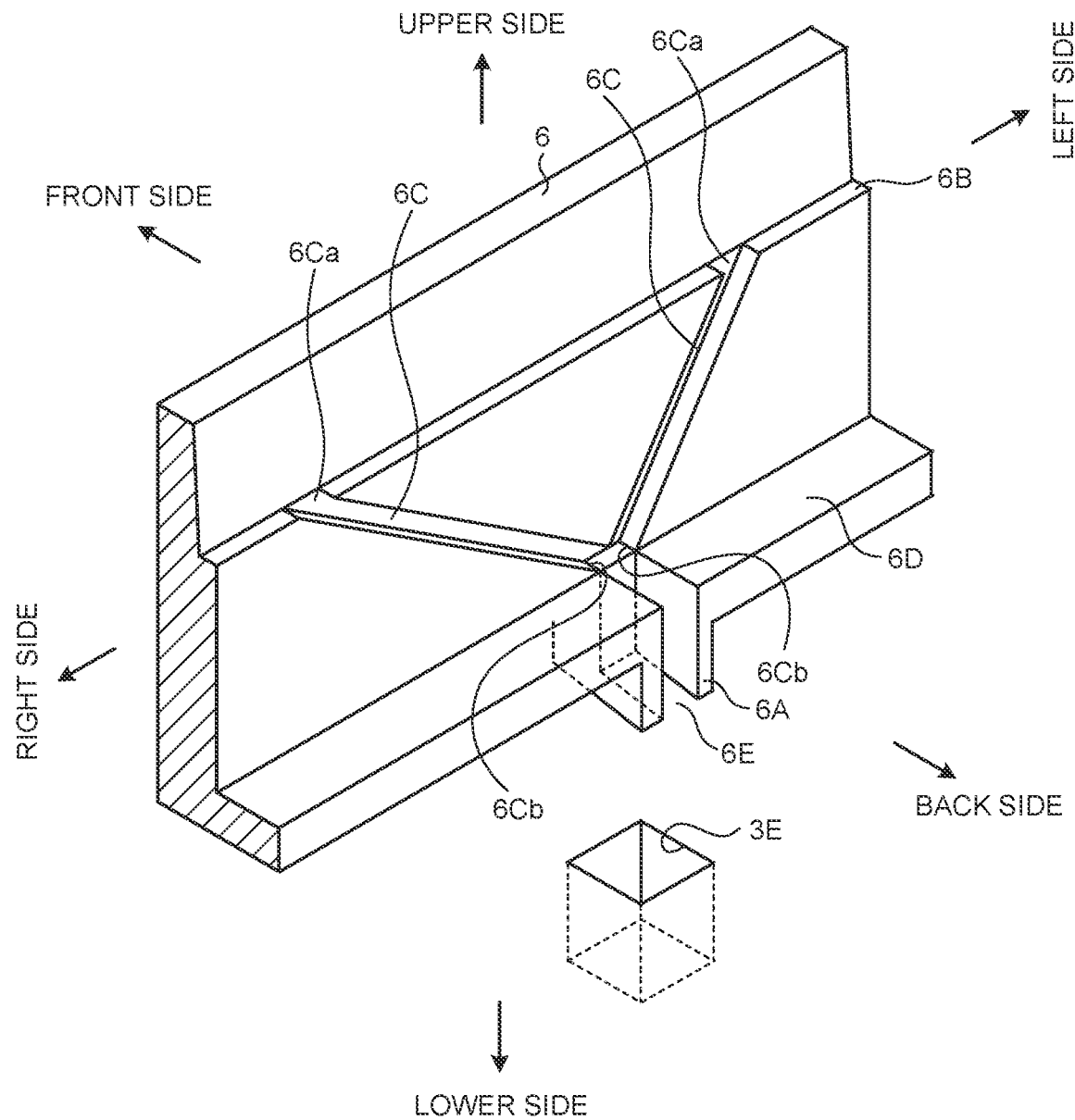
FIG. 4 is a partially enlarged perspective view of the holder.

Hereinafter, the drainage structure will be described. FIG. 3 is a back view of the holder. FIG. 4 is a partially enlarged perspective view of the holder.

As illustrated in FIGS. 2 to 4, the plurality of grooves 6C each continuously extending in an up-down direction on the back, which faces the display panel 2, of the above-described holder 6. Upper ends 6Ca of the grooves 6C open at the stepped portion 6B. Each of the grooves 6C continuously formed downward at a portion where the holder 6 is in contact with the front of the display panel 2 on the lower side of the stepped portion 6B. Lower ends 6Cb of the grooves 6C (at least two grooves) are formed so as to be connected to each other. The connection of the grooves 6C may not necessarily obtained by the connection of the lower ends 6Cb. Instead, in the case of two grooves 6C, the lower end 6Cb of one groove 6C may be connected to the middle of the other groove 6C, for example. As illustrated in FIGS. 3 and 4, each of the grooves 6C has different right and left positions of the upper end 6Ca and the lower end 6Cb with respect to the vertical direction. Each of the grooves 6C is formed so as to be inclined in the left-right direction from the upper end 6Ca to the lower end 6Cb between the upper end 6Ca and the lower end 6Cb when viewed from the back (front). The inclination is preferably linearly formed, but may be curved or bent. Furthermore, as illustrated in FIG. 3, the grooves 6C are formed so as to avoid a position on the back side of the switch element 5A mounted on the front of the circuit board 5.

Furthermore, a flange portion 6D protruding toward the back side is formed at the lower end of the holder 6, and the protrusion 6A is formed on the lower side of the flange portion 6D. The lower end 6Cb of each of the grooves 6C extends to the position of the flange portion 6D. The flange portion 6D and the protrusion 6A are formed with a cut portion 6E to which the lower ends 6Cb of the grooves 6C extending to the position of the flange portion 6D lead. The cut portion 6E continuously extends downward from the lower ends 6Cb of the grooves 6C to the lower end of the protrusion 6A. The cut portion 6E is formed so as to open to the upper side of the flange portion 6D, the back side of the protrusion 6A, and the lower side of the protrusion 6A. As illustrated in FIG. 2, when the protrusion 6A is inserted into the through hole 3E of the front panel 3, the cut portion 6E extends in the up-down direction along the through hole 3E, and leads from the bottom of the front panel 3 to the outside of the front panel 3. Therefore, the lower ends 6Cb of the grooves 6C lead from the bottom of the front panel 3 to the outside of the front panel 3 through the cut portion 6E and the through hole 3E.

As described above, the electronic device 1 of the present embodiment includes: the display panel 2 including the display surface 2A on the front; the front panel 3 surrounding the display panel 2; the circuit board 5 that is disposed on the front side of the lower portion of the display panel 2 and housed in the front panel 3; and the holder 6 provided between the front of the display panel 2 and the back of the circuit board 5. The holder 6 includes the plurality of grooves 6C each continuously extending in the up-down direction on the back of the holder 6 facing the front of the display panel 2. The grooves 6C are formed so as to be connected to each other. The front panel 3 is formed with the through hole 3E facing the lower ends 6Cb of the grooves 6C.

Therefore, when water flowing on the front surface of the display panel 2 enters the inside of the front panel 3 through the above-described gaps S1 and S2, the water can be drained from the grooves 6C to the outside of the front panel 3 through the through hole 3E, by using the grooves 6C formed on the back facing the front of the display panel 2 in the holder 6 and the through hole 3E formed so as to face the lower ends 6Cb of the grooves 6C in the front panel 3. In addition, since the plurality of grooves 6C are connected to each other, good drainage efficiency can be achieved without providing a plurality of through holes 3E corresponding to the plurality of grooves 6C, respectively. As a result, the electronic device 1 of the present embodiment can improve the drainage performance.

Furthermore, the groove 6C is formed to be inclined.

Therefore, the inclined groove 6C guides water from some portions of the plurality of grooves 6C to the through hole 3E. As a result, the electronic device 1 of the present embodiment can improve the performance of draining water that has enters the inside.

Furthermore, the holder 6 includes the protrusion 6A fitted in the through hole 3E and formed at the position of the lower ends 6Cb of the grooves 6C.

The holder 6 is attached to the front panel 3 by fitting the protrusion 6A into the through hole 3E. Therefore, the through hole 3E for attaching the holder 6 can also be used for drainage, and water can be drained by using a portion where the holder 6 and the front panel 3 are in contact with each other.

Furthermore, the protrusion 6A has the cut portion 6E. The lower ends 6Cb of the grooves 6C lead to the cut portion 6E. The cut portion 6E is provided along the through hole 3E.

Therefore, water passing through the grooves 6C can be drained from the cut portion 6E of the protrusion 6A through the through hole 3E, and the drainage performance can be further improved.

Furthermore, the circuit board 5 includes the switch element 5A mounted on the front. As illustrated in FIG. 3, the grooves 6C are formed so as to avoid the position on the back side of the switch element 5A.

When the switch element 5A is pushed and operated from the front, the circuit board 5 is pushed to the back side, and the holder 6 generates reaction force to support the circuit board 5. When the grooves 6C are positioned on the back side of the switch element 5A, the holder 6 has difficulty in generating the reaction force, which may cause deterioration of a function of supporting the circuit board 5. For that reason, the grooves 6C that are formed so as to avoid the position on the back side of the switch element 5A allows the holder 6 to generate the reaction force and have a secure function of supporting the circuit board 5 while improving the drainage performance. The fact that the groove 6C is formed so as to avoid the position on the back side of the switch element 5A means that even if the groove 6C overlaps a part of the back side of the switch element 5A, the other part is avoided. Furthermore, in a form in which the grooves 6C avoid the position on the back side of the switch element 5A, the grooves 6C are preferably formed in a line shape narrower than the area on the back side of the switch element 5A.

Furthermore, the display panel 2 is configured as a touch panel including a pressure-sensitive display surface 2A, and the holder 6 is disposed with the gap S1 between the holder 6 and the display surface 2A.

In the display panel 2 configured as a touch panel including a pressure-sensitive display surface 2A, erroneous operation may occur when the holder 6 comes in contact with the display panel 2, so that the gap S1 is needed. For that reason, water is likely to enter through the gap S1. However, since the electronic device 1 of the present embodiment has the improved drainage performance, the drainage can be ensured with the gap S1 while ensuring the function of the pressure-sensitive touch panel.

Furthermore, in the electronic device 1 of the present embodiment, as illustrated in FIG. 2, a passage R for sending air is provided outside the front panel 3 at a position of the opening of the through hole 3E.

The passage R is provided so as to generate a flow of air passing through the position of the opening of the through hole 3E. In the electronic device 1 mounted inside a vehicle, the passage R can be achieved by generating wind with an air conditioner. Then, the air flow generates a negative pressure at the opening of the through hole 3E, and water is drained from the through hole 3E to the outside of the front panel 3. As a result, the electronic device 1 of the present embodiment can improve the drainage performance.

According to the present disclosure, when water flowing on the front surface of a display panel enters the inside of the front panel, the water can be drained from the grooves to the outside of the front panel through the through hole, by using the grooves formed on the back facing the front of the display panel in the holder and the through hole formed so as to face the lower end of the groove in the front panel. In addition, since the plurality of grooves are connected to each other, high drainage efficiency can be achieved without providing a plurality of through holes corresponding to the plurality of grooves, respectively. As a result, according to the present disclosure, drainage performance can be improved.

What is claimed is:

1. An electronic device comprising:
   a display panel including a display surface on a front;
   a front panel surrounding the display panel;
   a circuit board that is disposed on a front side of a lower portion of the display panel and housed in the front panel; and
   a holder provided between the front of the display panel and a back of the circuit board,
   wherein
   the holder includes a plurality of grooves each continuously extending in an up-down direction on a back of the holder facing the front of the display panel, the grooves being formed so as to be connected to each other, and
   the front panel is formed with a through hole facing lower ends of the grooves.

2. The electronic device according to claim 1, wherein each of the plurality of grooves is formed to be inclined.

3. The electronic device according to claim 1, wherein
the holder includes a protrusion that is fitted in the through hole and is formed at a position of the lower ends of the grooves.

4. The electronic device according to claim 3, wherein
the protrusion includes a cut portion to which the lower ends of the grooves lead and which is provided along the through hole.

5. The electronic device according to claim 1, wherein
the circuit board includes a switch element mounted on the front, and
the grooves are formed so as to avoid a position on a back side of the switch element.

6. The electronic device according to claim 1, wherein
the display panel is configured as a touch panel including the display surface of a pressure-sensitive type, and
the holder is disposed with a gap between the holder and the display surface.

7. The electronic device according to claim 1, wherein
a passage for sending air is provided outside the front panel at a position of an opening of the through hole.

\* \* \* \* \*